(12) United States Patent
Kim et al.

(10) Patent No.: US 12,203,996 B2
(45) Date of Patent: Jan. 21, 2025

(54) BATTERY MANAGEMENT SYSTEM, BATTERY PACK, ELECTRIC VEHICLE AND BATTERY MANAGEMENT METHOD

(71) Applicant: LG Energy Solution, Ltd., Seoul (KR)

(72) Inventors: Young-Min Kim, Daejeon (KR); Cheol-Taek Kim, Daejeon (KR); Yong-Chul Sung, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 140 days.

(21) Appl. No.: 18/025,439

(22) PCT Filed: Jun. 14, 2022

(86) PCT No.: PCT/KR2022/008407
§ 371 (c)(1),
(2) Date: Mar. 9, 2023

(87) PCT Pub. No.: WO2022/265358
PCT Pub. Date: Dec. 22, 2022

(65) Prior Publication Data
US 2023/0333170 A1 Oct. 19, 2023

(30) Foreign Application Priority Data
Jun. 14, 2021 (KR) .................. 10-2021-0077048

(51) Int. Cl.
*G01R 31/382* (2019.01)
*B60L 3/00* (2019.01)
(Continued)

(52) U.S. Cl.
CPC .......... *G01R 31/382* (2019.01); *B60L 3/0046* (2013.01); *B60L 58/12* (2019.02);
(Continued)

(58) Field of Classification Search
CPC .. G01R 31/382; G01R 31/367; G01R 31/396; G01R 31/52; G01R 19/16542;
(Continued)

(56) References Cited

U.S. PATENT DOCUMENTS

2011/0184677 A1 7/2011 Tae et al.
2012/0175953 A1 7/2012 Ohkawa et al.
(Continued)

FOREIGN PATENT DOCUMENTS

JP 6038467 B2 12/2016
JP 2018091631 A 6/2018
(Continued)

OTHER PUBLICATIONS

International Search Report for Application No. PCT/KR2022/008407 mailed Sep. 15, 2022, pp. 1-3.
(Continued)

*Primary Examiner* — Giovanni Astacio-Oquendo
(74) *Attorney, Agent, or Firm* — Lerner David LLP (57) ABSTRACT

A battery management system includes a sensing circuit to acquire a state parameter of each of a plurality of battery cells connected in series; and a control circuit to determine, for each battery cell, a first state of charge (SOC) change which is a difference between a first SOC at a first charge time and a second SOC at a second charge time by applying a SOC estimation algorithm to the state parameter acquired during charging. The control circuit determines a reference factor by applying a statistical algorithm to the first SOC changes of at least two of the plurality of battery cells. The control circuit detects an internal short circuit fault in each battery cell based on the first SOC change of each battery cell and the reference factor.

14 Claims, 7 Drawing Sheets

(51) Int. Cl.
*B60L 58/12* (2019.01)
*B60L 58/18* (2019.01)
*G01R 31/367* (2019.01)
*G01R 31/396* (2019.01)
*G01R 31/52* (2020.01)
*H02J 7/00* (2006.01)

(52) U.S. Cl.
CPC ............ *B60L 58/18* (2019.02); *G01R 31/367* (2019.01); *G01R 31/396* (2019.01); *G01R 31/52* (2020.01); *H02J 7/0013* (2013.01); *H02J 7/0048* (2020.01)

(58) Field of Classification Search
CPC .............. G01R 31/3842; G01R 31/392; G01R 19/003; G01R 31/3648; B60L 3/0046; B60L 58/12; B60L 58/18; B60L 2260/44; B60L 3/0069; B60L 3/12; B60L 58/13; B60L 58/21; H02J 7/0013; H02J 7/0048; H02J 2310/48; H02J 7/0029; Y02E 60/10; B60Y 2200/91; B60Y 2306/15; Y02T 10/70
USPC ......................................... 324/434, 426, 425
See application file for complete search history.

(56) References Cited

U.S. PATENT DOCUMENTS

| | | |
|---|---|---|
| 2020/0049773 A1 | 2/2020 | Cho et al. |
| 2020/0072912 A1 | 3/2020 | Chun et al. |
| 2020/0266645 A1 | 8/2020 | Kim et al. |
| 2021/0286013 A1 | 9/2021 | Sano et al. |
| 2022/0229122 A1 | 7/2022 | Lee et al. |
| 2022/0268856 A1 | 8/2022 | Kim et al. |
| 2022/0317192 A1 | 10/2022 | Lee et al. |
| 2022/0317196 A1 | 10/2022 | Lee et al. |
| 2024/0044999 A1* | 2/2024 | Park .................. G01R 31/392 |
| 2024/0192280 A1* | 6/2024 | Kim .................. G01R 31/3835 |
| 2024/0272227 A1* | 8/2024 | Lee .................. H01M 10/48 |

FOREIGN PATENT DOCUMENTS

| | | |
|---|---|---|
| JP | 6527356 B2 | 6/2019 |
| KR | 20110087569 A | 8/2011 |
| KR | 101930647 B1 | 3/2019 |
| KR | 20200024637 A | 3/2020 |
| KR | 20200101754 A | 8/2020 |
| KR | 20210000207 A | 1/2021 |
| KR | 20210031336 A | 3/2021 |
| KR | 102238559 B1 | 4/2021 |
| KR | 20210054407 A | 5/2021 |
| KR | 20210064931 A | 6/2021 |
| KR | 20210066609 A | 6/2021 |
| WO | 2011037257 A1 | 3/2011 |

OTHER PUBLICATIONS

Zheng Yuejiu et al: "Micro-Short-Circuit Cell Fault Identification Method for Lithium-Ion Battery Packs Based on Mutual Information", IEEE Transactions On Industrial Electronics, IEEE Service Center, Piscataway, NJ, USA, vol. 68, No. 5, Apr. 9, 2020 (Apr. 9, 2020), pp. 4373-4381, XP011836688, ISSN: 0278-0046, DOI: 10.1109/TIE.2020.2984441 [retrieved on Feb. 8, 2021].
EESR for Application No. 22825283.9 dated Mar. 4, 2024. 9 pgs.

* cited by examiner

FIG. 7

BATTERY MANAGEMENT SYSTEM, BATTERY PACK, ELECTRIC VEHICLE AND BATTERY MANAGEMENT METHOD

CROSS-REFERENCE TO RELATED APPLICATIONS

The present application is a national phase entry under 35 U.S.C. § 371 of International Application No. PCT/KR/2022/008407 filed on Jun. 14, 2022, which claims priority from Korean Patent Application No. 10-2021-0077048 filed on Jun. 14, 2021 with the Korean Intellectual Property Office, all of which are incorporated herein by reference.

TECHNICAL FIELD

The present disclosure relates to internal short circuit fault detection for a battery cell.

BACKGROUND ART

Recently, there has been a rapid increase in the demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

To meet the high voltage and high capacity requirements of electric vehicle applications, battery systems (for example, battery packs) including a plurality of battery cells connected in series are widely used.

In such a battery system, faults in some battery cells may be highly likely to have negative impacts on the performance and safety of the entire battery system. Accordingly, in the management of the battery system, it is important to properly detect faults in the individual battery cells.

Among various types of battery cell faults, an internal short circuit fault is a main fault that affects fires directly/indirectly. The internal short circuit fault is caused by side reactions in the battery cells and/or infiltration of impurities into the battery cells. The conventional technology detects the internal short circuit fault in each battery cell using a difference between the minimum voltage and the maximum voltage of the plurality of battery cells and/or the magnitude of voltage drop observed during rest.

However, since the minimum voltage and the maximum voltage are parameters that are greatly affected by other factors (for example, full charge capacity, degradation level, temperature, internal resistance of the individual battery cells) than the internal short circuit fault, the accuracy of internal short circuit fault detection based on the difference between the minimum voltage and the maximum voltage is low. Furthermore, since in the series connection structure of the plurality of battery cells, it is thought that the charge/discharge current of equal magnitude flows through all the battery cells, it is difficult to extract useful information related to the internal short circuit fault of the individual battery cells from the integral of the charge/discharge current itself.

Additionally, it is necessary to leave all the battery cells undisturbed for a few hours to a few days to detect the internal short circuit fault based on the magnitude of voltage drop observed during rest.

SUMMARY

Technical Problem

The present disclosure is designed to solve the above-described problem, and therefore the present disclosure is directed to providing a battery management system a battery pack, an electric vehicle and a battery management method for detecting an internal short circuit fault in each of battery cells connected in series using state of charge (SOC) changes during the charging and/or discharging of each battery cell.

These and other objectives and advantages of the present disclosure may be understood by the following description and will be apparent from an embodiment of the present disclosure. In addition, it will be readily understood that the objectives and advantages of the present disclosure may be realized by the means set forth in the appended claims and a combination thereof.

Technical Solution

A battery management system according to an aspect of the present disclosure is for a battery pack including a plurality of battery cells connected in series. The battery management system includes a sensing circuit configured to acquire a state parameter of each battery cell; and a control circuit configured to determine, for each battery cell, a first state of charge (SOC) change which is a difference between a first SOC at a first charge time and a second SOC at a second charge time by applying a SOC estimation algorithm to the state parameter acquired during charging of the battery pack. The control circuit is configured to determine a reference factor by applying a statistical algorithm to the first SOC changes of at least two of the plurality of battery cells. The control circuit is configured to for each battery cell, detect an internal short circuit fault in the battery cell based on the first SOC change of the battery cell and the reference factor.

The control circuit may be configured to determine the reference factor to be equal to an average or median of at least two of the first SOC changes of the plurality of battery cells.

The control circuit may be configured to, for each battery cell, determine the internal short circuit fault in response to a ratio of the first SOC change to the reference factor being equal to or smaller than a threshold.

The control circuit may be configured to, for each battery cell, calculate a ratio of the first SOC change to the reference factor at a plurality of different charge times, and determine the internal short circuit fault in response to the ratio of the first SOC change to the reference factor at one charge time being smaller than the ratio of the first SOC change to the reference factor at a previous charge time by a threshold or more.

The control circuit may be configured to determine, for each battery cell, a second SOC change which is a difference between a third SOC at a first discharge time and a fourth SOC at a second discharge time by applying the SOC estimation algorithm to the state parameter acquired during discharging of the battery pack. The control circuit may be configured to for each battery cell, determine a fault factor of the battery cell by dividing the first SOC change of the battery cell by the second SOC change of the battery cell. The control circuit may be configured to determine a second reference factor by applying the statistical algorithm to the fault factors of at least two of the plurality of battery cells. The control circuit may be configured to for each battery cell, detect the internal short circuit fault in the battery cell based on the fault factor of the battery cell and the second reference factor.

The control circuit may be configured to determine the second reference factor to be equal to an average or median of the fault factors of at least two of the plurality of battery cells. The control circuit may be configured to for each battery cell, detect the internal short circuit fault in the battery cell by comparing the fault factor of the battery cell with the second reference factor.

The control circuit may be configured to, for each battery cell, determine the internal short circuit fault in response to a ratio of the fault factor to the second reference factor being equal to or smaller than a threshold.

The control circuit may be configured to, for each battery cell, calculate a ratio of the fault factor to the second reference factor at a plurality of different discharge times and determine the internal short circuit fault in response to a ratio of the fault factor to the second reference factor at one discharge time being smaller than the ratio of the fault factor to the second reference factor at a previous discharge time by a threshold or more.

A battery pack according to another aspect of the present disclosure includes the battery management system of any of the embodiments disclosed herein.

An electric vehicle according to still another aspect of the present disclosure includes the battery pack.

A battery management method according to further another aspect of the present disclosure is for a battery pack including a plurality of battery cells connected in series. The battery management method includes determining, by a control circuit, for each battery cell, a first state of charge (SOC) change which is a difference between a first SOC at a first charge time and a second SOC at a second charge time by applying an SOC estimation algorithm to a state parameter of each of the plurality of battery cells acquired during charging of the battery pack; determining, by the control circuit, a reference factor by applying a statistical algorithm to the first SOC changes of at least two of the plurality of battery cells; and for each battery cell, detecting, by the control circuit, an internal short circuit fault in the battery cell based on the first SOC change of the battery cell and the reference factor.

In some examples, the reference factor may be equal to an average or median of at least two of the first SOC changes of the plurality of battery cells.

In some examples, detecting the internal short circuit fault may be based on a ratio of the first SOC change to the reference factor being equal to or smaller than a threshold.

In some examples, detecting the internal short circuit fault may be based on a ratio of the first SOC change to the reference factor at one charge time being smaller than the ratio of the first SOC change to the reference factor at a previous charge time by a threshold or more.

Advantageous Effects

According to at least one of the embodiments of the present disclosure, it is possible to detect an internal short circuit fault in each of battery cells connected in series using state of charge (SOC) changes during the charging and/or discharging of each battery cell.

The effects of the present disclosure are not limited to the above-mentioned effects, and these and other effects will be clearly understood by those skilled in the art from the appended claims.

BRIEF DESCRIPTION OF THE DRAWINGS

The accompanying drawings illustrate an exemplary embodiment of the present disclosure, and together with the detailed description of the present disclosure as described below, serve to provide a further understanding of the technical aspects of the present disclosure, and thus the present disclosure should not be construed as being limited to the drawings.

DETAILED DESCRIPTION

Hereinafter, an exemplary embodiment of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiment described herein and the illustration shown in the drawings is just an exemplary embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements.

Unless the context clearly indicates otherwise, it will be understood that the term "comprises" when used in this specification, specifies the presence of stated elements, but does not preclude the presence or addition of one or more other elements. Additionally, the term "control circuit" as used herein refers to a processing unit of at least one function or operation, and may be implemented in hardware and software either alone or in combination.

In addition, throughout the specification, it will be further understood that when an element is referred to as being "connected to" another element, it can be directly connected to the other element or intervening elements may be present.

Figure 1:
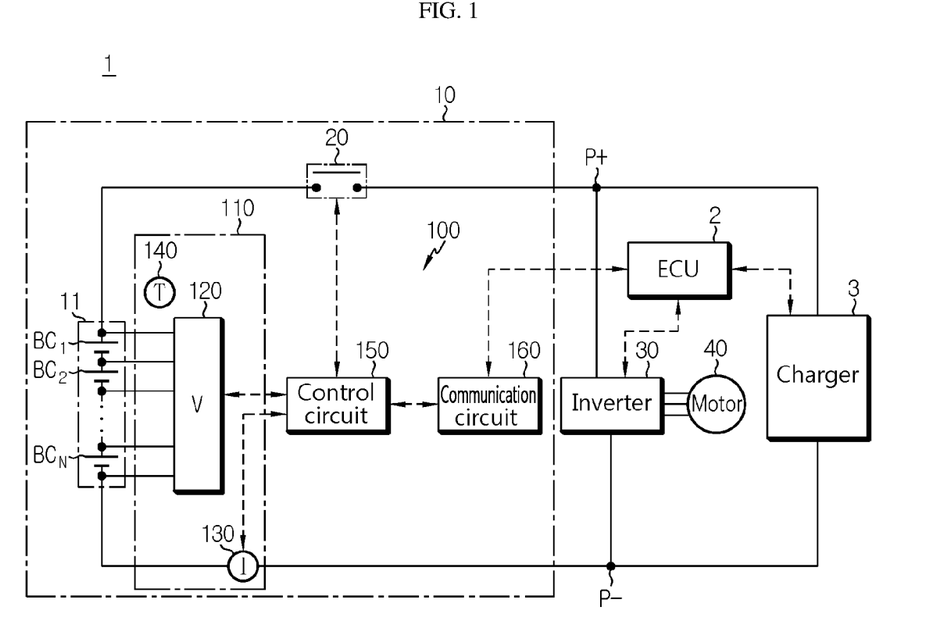
FIG. 1 is a diagram exemplarily showing the components of an electric vehicle according to the present disclosure.

FIG. 1 is a diagram exemplarily showing the components of an electric vehicle according to the present disclosure.

Referring to FIG. 1, the electric vehicle 1 includes a vehicle controller 2, a battery pack 10, an inverter 30 and an electric motor 40. Charge/discharge terminals P+, P− of the battery pack 10 may be electrically coupled to a charger 3 through a charging cable. The charger 3 may be included in the electric vehicle 1, or may be disposed in a charging station.

The vehicle controller 2 (for example, an Electronic Control Unit (ECU)) is configured to transmit a key-on signal to a battery management system 100 in response to an ignition button (not shown) of the electric vehicle 1 being changed to ON-position by a user. The vehicle controller 2 is configured to transmit a key-off signal to the battery management system 100 in response to the ignition button being changed to OFF-position by the user. The charger 3 may supply the charge power of constant current or constant voltage through the charge/discharge terminals P+, P− of the battery pack 10 by the communication with the vehicle controller 2. The charger 3 may have a discharging function, and before the start of a first charging stage Si as described below, may discharge a battery 11 to reduce a battery voltage (for example, an open-circuit voltage (OCV)) of the battery 11 below a predetermined reference voltage in response to a request from the vehicle controller 2.

The battery pack 10 includes the battery 11, a relay 20 and the battery management system 100.

The battery 11 includes a plurality of battery cells $BC_1 \sim BC_N$ (N is a natural number of 2 or greater). The plurality of battery cells $BC_1 \sim BC_N$ is connected in series. The plurality of battery cells $BC_1 \sim BC_N$ may be provided with the same electrical and chemical specification, wherein N is a natural number of 2 or greater. Hereinafter, in the common description to the plurality of battery cells $BC_1 \sim BC_N$, the reference character 'BC' is given to the battery cell.

The battery cell BC is not limited to a particular type, and may include any type of battery cell that can be recharged repeatedly, for example, a lithium ion cell.

The relay 20 is connected in series to the battery 11 through a power path connecting the battery 11 and the inverter 30. FIG. 1 shows the relay 20 connected between a positive terminal of the battery 11 and the charge/discharge terminal P+. The relay 20 is controlled into on/off in response to a switching signal from the battery management system 100. The relay 20 may be a mechanical contactor that is turned on and off by the electromagnetic force of the coil or a semiconductor switch such as Metal Oxide Semiconductor Field Effect transistor (MOSFET).

The inverter 30 is provided to convert a direct current from the battery 11 included in the battery pack 10 to an alternating current in response to a command from the battery management system 100 or the vehicle controller 2. The electric motor 40 operates using the alternating current power from the inverter 30. The electric motor 40 may include, for example, a 3-phase alternating current motor. The components in the electric vehicle 1 supplied with the discharge power of the battery 11, including the inverter 30 and the electric motor 40, may be referred collectively to as electrical loads.

The battery management system 100 includes a sensing circuit 110 and a control circuit 150. The battery management system 100 may further include a communication circuit 160.

The sensing circuit 110 is configured to acquire a state parameter of the battery cell BC. The state parameter of the battery cell BC includes a voltage, a current and/or a temperature of the battery cell BC. The sensing circuit 110 includes a voltage detector 120 and a current detector 130. The sensing circuit 110 may further include a temperature detector 140.

The voltage detector 120 is connected to the positive terminal and the negative terminal of each of the plurality of battery cells $BC_1 \sim BC_N$ included in the battery 11, and is configured to measure a voltage across the battery cell BC and generate a voltage signal indicating the measured voltage.

The current detector 130 is connected in series to the battery 11 through the current path between the battery 11 and the inverter 30. The current detector 130 is configured to measure the charge/discharge current flowing through the battery 11 and generate a current signal indicating the measured charge/discharge current. Since the plurality of battery cells $BC_1 \sim BC_N$ is connected in series, the common charge/discharge current flows through the plurality of battery cells $BC_1 \sim BC_N$. The current detector 130 may include at least one of known current detection devices such as a shunt resistor and a hall effect device.

The temperature detector 140 is configured to measure the temperature of the battery 11 or a battery temperature and generate a temperature signal indicating the measured battery temperature. The temperature detector 140 may be disposed in a case 13 to measure the temperature close to the actual temperature of the battery 11. For example, the temperature detector 140 may be attached to the surface of at least one battery cell BC included in the battery 11 to detect the surface temperature of the battery cell BC as the battery temperature. The temperature detector 140 may include at least one of known temperature detection devices such as a thermocouple, a thermistor and a bimetal.

The communication circuit 160 is configured to support wired or wireless communication between the control circuit 150 and the vehicle controller 2. The wired communication may be, for example, controller area network (CAN) communication, and the wireless communication may be, for example, Zigbee or Bluetooth communication. The communication protocol is not limited to a particular type and may include any type of communication protocol that supports wired/wireless communication between the control circuit 150 and the vehicle controller 2. The communication circuit 160 may include an output device (for example, a display, a speaker) to provide information received from the control circuit 150 and/or the vehicle controller 2 into a recognizable format for the user (a driver).

The control circuit 150 is operably coupled to the relay 20, the sensing circuit 110 and the communication circuit 160. Operably coupled refers to connected directly/indirectly to transmit and receive a signal in one or two directions.

The control circuit 150 may collect the voltage signal from the voltage detector 120, the current signal from the current detector 130 and/or the temperature signal from the temperature detector 140. That is, the control circuit 150 may convert and record each analog signal collected from the sensors 120, 130, 140 to a digital value using an Analog to Digital Converter (ADC) within the control circuit 150.

The control circuit 150 may be referred to as a 'battery controller', and may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing the other functions.

Memory 151 may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM). The memory 151 may store data and programs required for the computation by the control circuit 150. The memory 151 may store data indicating the computation results by the control circuit 150. The memory 151 may store a state of charge (SOC) estimation algorithm and a statistical algorithm used to detect an internal short circuit fault in the battery cell BC. The memory 151 may be integrated into the control circuit 150.

When the relay 20 is turned on during the operation of the electrical loads 30, 40 and/or the charger 3, the battery 11 goes into a charge mode or a discharge mode. When the relay 20 is turned off while in the charge mode or the discharge mode, the battery 11 is switched to a rest mode.

The control circuit 150 may turn on the relay 20 in response to the key-on signal. The control circuit 150 may turn off the relay 20 in response to the key-off signal. The key-on signal is a signal that requests to switch from the rest to the charge or discharge. The key-off signal is a signal that requests to switch from the charge or discharge to the rest. Alternatively, instead of the control circuit 150, the vehicle controller 2 may take responsibility for the ON/OFF control of the relay 20.

The control circuit 150 may monitor the voltage of each of the plurality of battery cells $BC_1$~$BC_N$ and identify the maximum voltage of the plurality of battery cells $BC_1$~$BC_N$ during the charging of the battery pack 10. The maximum voltage is the maximum one of the voltages of the plurality of battery cells $BC_1$~$BC_N$.

The control circuit 150 may monitor the voltage of each of the plurality of battery cells $BC_1$~$BC_N$ and identify the minimum voltage during the discharging of the battery pack 10. The minimum voltage is the minimum one of the voltages of the plurality of battery cells $BC_1$~$BC_N$.

The control circuit 150 may stop the charging of the battery pack 10 when the maximum voltage of the plurality of battery cells $BC_1$~$BC_N$ reaches a predetermined upper voltage limit (for example, 4.25 V[volt]) during the charging of the battery pack 10.

The control circuit 150 may stop the discharging of the battery pack 10 when the minimum voltage of the plurality of battery cells $BC_1$~$BC_N$ reaches a predetermined lower voltage limit (for example, 3.20 V) during the discharging of the battery pack 10.

Figure 2:
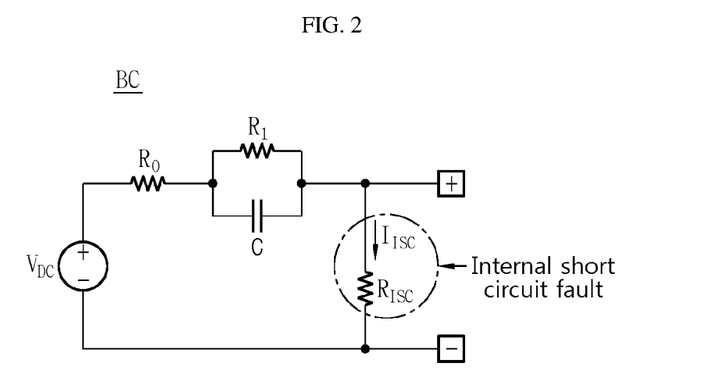
FIG. 2 is a diagram for reference in describing an exemplary equivalent circuit of a battery cell.

FIG. 2 is a diagram for reference in describing an exemplary equivalent circuit of the battery cell. In the specification, a normal battery cell refers to any of the plurality of battery cells $BC_1$~$BC_N$ having no internal short circuit fault, and a faulty battery cell refers to any of the plurality of battery cells $BC_1$~$BC_N$ having the internal short circuit fault.

Referring to FIG. 2, the normal battery cell may be equalized to a series circuit of a direct current voltage source $V_{DC}$, an internal resistance component $R_0$ and a RC pair $R_1$, C. In contrast, the faulty battery cell may be equalized to an additional resistance component $R_{ISC}$ connected between two terminals of the series circuit corresponding to the normal battery cell. The additional resistance component $R_{ISC}$ acts as a path of a leakage current $I_{ISC}$.

During the charging of the faulty battery cell, some of the charge power is not stored in the faulty battery cell and is used up as the leakage current $I_{ISC}$. Additionally, during the discharging of the faulty battery cell, some of the discharge power is consumed as the leakage current $I_{ISC}$, but not supplied to the electrical loads. For reference, while in rest, energy stored in the faulty battery cell is consumed as the leakage current $I_{ISC}$ in the same way as the discharge of the faulty battery cell. A reduction in resistance value of resistor $R_{ISC}$ signifies that the internal short circuit fault gets worse, and as the internal short circuit fault gets worse, power consumption by the leakage current $I_{ISC}$ may increase.

As a result, in the charge, a voltage change (i.e., an increase in SOC) of the faulty battery cell is smaller than that of the normal battery. In contrast, in the discharge, a voltage change (i.e., a decrease in SOC) of the faulty battery cell is larger than that of the normal battery cell.

Figure 3:
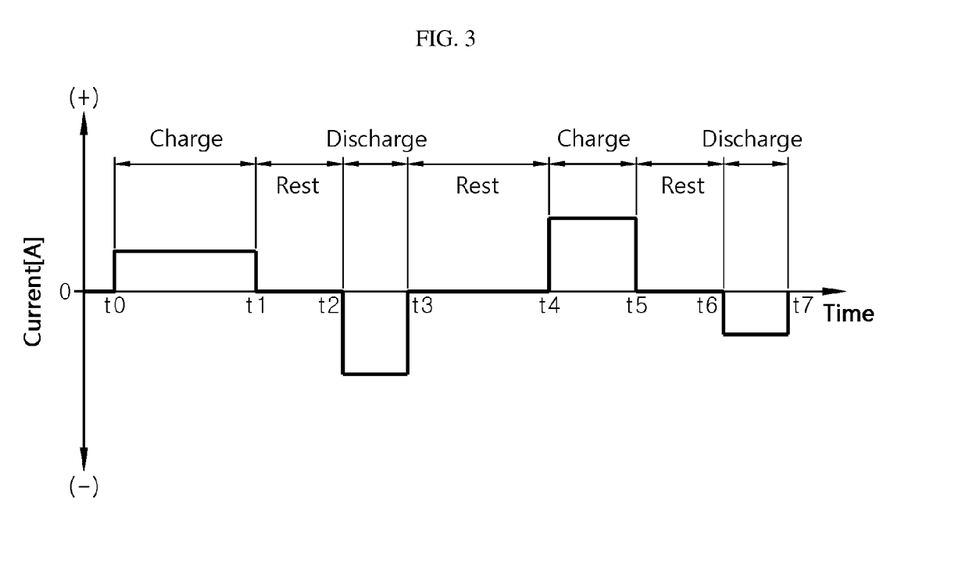
FIGS. 3 to 5 are exemplary graphs for reference in comparing state of charge (SOC) changes of battery cells in the presence or absence of an internal short circuit fault.
Figure 4:
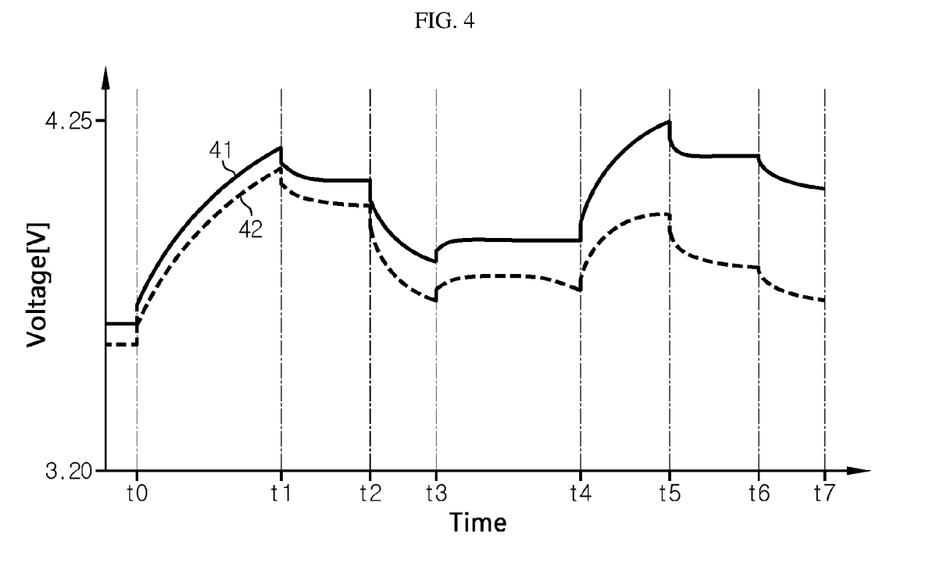
Figure 5:
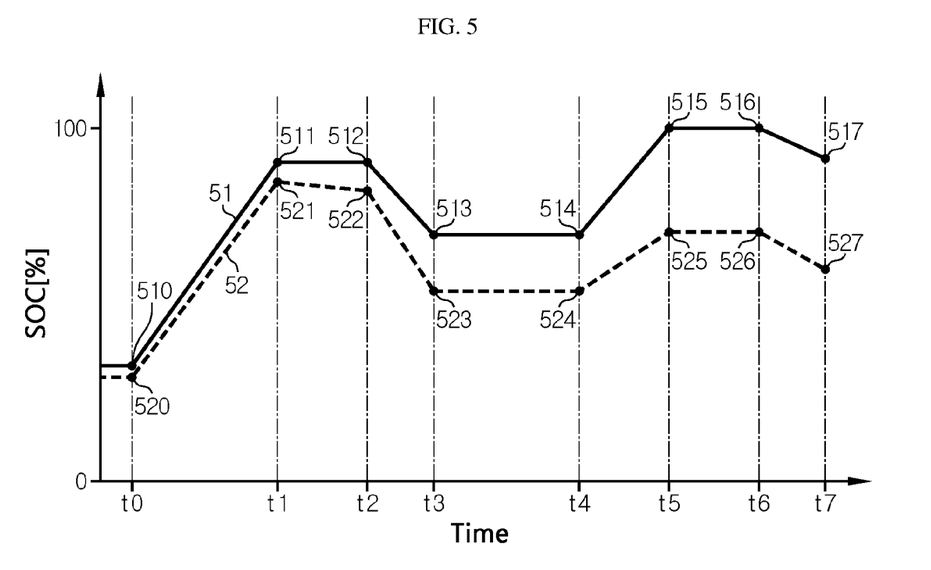

FIGS. 3 to 5 are exemplary graphs for reference in comparing the SOC changes of the battery cells in the presence or absence of the internal short circuit fault. FIGS. 3 to 5 show the charge/discharge current, the voltage of the battery cell BC and the SOC change of the battery cell BC in the same period of time, respectively.

Referring to FIG. 3, time t0 and time t4 indicate the point in time of rest-to-charge switching, time t1 and time t5 indicate the point in time of charge-to-rest switching, time t2 is the point in time of rest-to-discharge switching, and time t3 is the point in time of discharge-to-rest switching. That is, in FIG. 3, the period of time from time t0 to time t1 and the period of time from time t4 to time t5 are the charge period, the period of time from time t2 to time t3 is the discharge period, and the remainder is the rest period. For convenience of description, FIG. 3 shows that a positive value is given to the charge current in each charge period and a negative value is given to the discharge current in the discharge period, and the current in each period of time is constant.

In FIG. 4, a curve 41 shows the voltage curve of the normal battery cell corresponding to the current curve shown in FIG. 3, and a curve 42 shows the voltage curve of the faulty battery cell corresponding to the current curve shown in FIG. 3. The curve 41 may be treated as a time series of the average voltages of the plurality of battery cells $BC_1$~$BC_N$ The control circuit 150 may acquire the state parameter of each of the plurality of battery cells $BC_1$~$BC_N$ periodically or aperiodically, and record a time series of the state parameters in the memory 151.

Referring to FIG. 4, in the charge period, both the normal battery cell and the faulty battery cell gradually increase in voltage. However, the faulty battery cell has low charge power capacity than the normal battery cell, so the voltage rise of the faulty battery cell is smaller than that of the normal battery cell.

In the discharge period, both the normal battery cell and the faulty battery cell gradually decrease in voltage. However, in addition to the discharge power of the normal battery cell, additional power consumption by the leakage current $I_{ISC}$ occurs in the faulty battery cell, so the voltage drop of the faulty battery cell is larger than that of the normal battery cell.

In FIG. 5, a curve 51 shows the SOC curve of the normal battery cell corresponding to the voltage curve 41 shown in FIG. 4, and a curve 52 shows the SOC curve of the faulty battery cell corresponding to the voltage curve 42 shown in FIG. 4. The curve 51 may be treated as a time series of the average SOCs of the plurality of battery cells $BC_1$~$BC_N$.

The control circuit 150 may monitor the SOC change of the battery cell BC in the charge period, the discharge period and/or the rest period of the battery pack 10 by applying the SOC estimation algorithm to the state parameter of the battery cell BC. For example, the SOC estimation algorithm may include an OCV-SOC relationship map or a Kalman filter. The OCV-SOC relationship map and the Kalman filter is widely used for SOC estimation, and its detailed description is omitted.

Referring to FIG. 5, in the charge period, the faulty battery cell increases in SOC to a lesser extent at a lower rate than the normal battery cell. In the discharge period, the faulty battery cell decreases in SOC to a greater extent at a higher rate than the normal battery cell. Furthermore, in the rest period, the SOC of the normal battery cell is generally constant, while the SOC of the faulty battery cell slowly decreases though the charge/discharge current does not flow.

The control circuit 150 may perform a diagnosis process for detecting the internal short circuit fault in the battery cell BC based on the SOC changes of all the plurality of battery cells $BC_1$~$BC_N$ in the latest charge period each time the battery pack 10 is charged. For example, the control circuit 150 may detect the internal short circuit fault in the battery cell BC based on the SOC changes of all the plurality of battery cells $BC_1$~$BC_N$ acquired in charge period t0~t1 upon the charge-to-rest switching at time t1. In another example, the control circuit 150 may detect the internal short circuit fault in the battery cell BC based on the SOC changes of all the plurality of battery cells $BC_1$~$BC_N$ acquired in the latest charge period t4~t5 upon the charge-to-rest switching at time t5.

Alternatively, the control circuit 150 may perform the diagnosis process for detecting the internal short circuit fault in the battery cell BC based on the SOC changes of all the plurality of battery cells $BC_1$~$BC_N$ in the latest charge period and the SOC changes of all the plurality of battery cells $BC_1$~$BC_N$ in the latest discharge period each time the battery pack 10 is charged or discharged. For example, the control circuit 150 may detect the internal short circuit fault in the battery cell BC based on the SOC changes of all the plurality of battery cells $BC_1$~$BC_N$ acquired in the latest charge period t0~t1 and the SOC changes of all the plurality of battery cells $BC_1$~$BC_N$ acquired in the latest discharge period t2~t3 upon the discharge-to-rest switching at time t3. In another example, the control circuit 150 may detect the internal short circuit fault in the battery cell BC based on the SOC changes all the plurality of battery cells $BC_1$~$BC_N$ acquired in the latest discharge period t2~t3 and the SOC changes of all the plurality of battery cells $BC_1$~$BC_N$ acquired in the latest charge period t4~t5 upon the charge-to-rest switching at time t5.

FIGS. 3 to 5 show the rest mode between the charge period and the discharge period, but this is provided by way of illustration. For example, charge may be switched to discharge without rest, or discharge may be switched to charge without rest.

Figure 6:
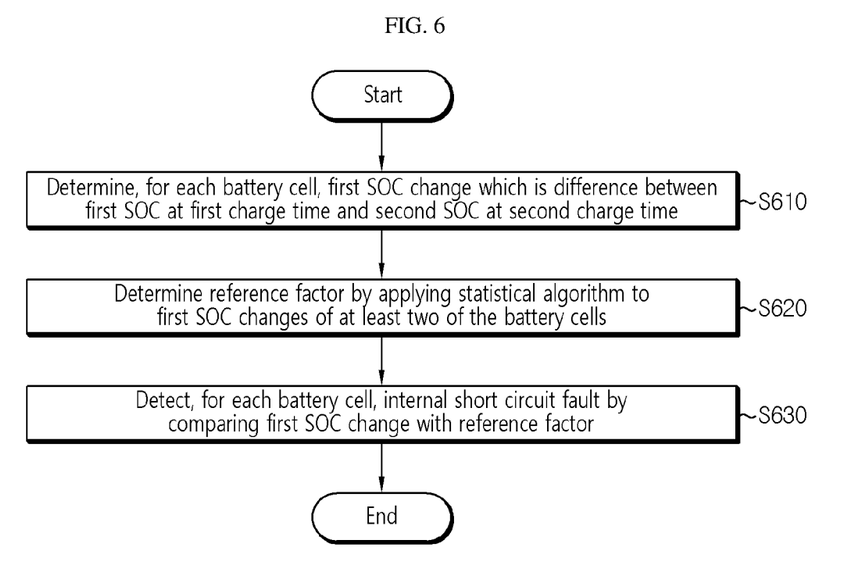
FIG. 6 is a flowchart exemplarily showing a battery management method according to a first embodiment of the present disclosure.

FIG. 6 is a flowchart exemplarily showing a battery management method according to a first embodiment of the present disclosure. The method of FIG. 6 is a method for detecting the internal short circuit fault in the battery cell BC based on the SOC trends of all the plurality of battery cells $BC_1$~$BC_N$ monitored in the latest charge period. For convenience of description, assume that the latest charge period ranges from time t4 to time t5.

Referring to FIGS. 1 to 6, in step S610, the control circuit 150 determines, for each battery cell BC, a first SOC change which is a difference between a first SOC at a first charge time and a second SOC at a second charge time by applying the SOC estimation algorithm to the state parameter of each of the plurality of battery cells $BC_1$~$BC_N$ acquired during the charging of the battery pack 10. The first charge time and the second charge time are not particularly limited in case they are two different points in time within the latest charge period. For example, the first charge time may be the start time t4 of the latest charge period, and the second charge time may be the end time t5 of the latest charge period. Since the method of FIG. 6 is related to charging, the first SOC change indicates a SOC increase from the first charge time to the second charge time. For example, referring to FIG. 5, the first SOC change of the faulty battery cell is a difference between the first SOC 524 and the second SOC 525.

In step S620, the control circuit 150 determines a reference factor by applying the statistical algorithm to the first SOC changes of at least two of the plurality of battery cells $BC_1$~$BC_N$. The reference factor may be equal to an average or median of the first SOC changes of at least two of the plurality of battery cells $BC_1$~$BC_N$. For example, referring to FIG. 5, in case that the curve 51 is an average of the first SOC changes, the reference factor is a difference between SOC 514 and SOC 515.

In step S630, the control circuit 150 detects, for each battery cell BC, the internal short circuit fault by comparing the first SOC change with the reference factor. At least one of the following detection requirements may be used to detect the internal short circuit fault.

[Requirement #1: the first SOC change should be smaller than the reference factor by a threshold TH1 or more]

[Requirement #2: a ratio of the first SOC change to the reference factor should be equal to or less than a threshold TH2, where TH2 is 0~1]

[Requirement #3: the ratio of the first SOC change to the reference factor should be smaller than its previous ratio by a threshold TH3 or more]

In the requirement #3, the previous ratio is a ratio of the first SOC change to the reference factor in the charge period (t0~t1 in FIG. 4) that is earlier than the latest charge period.

The thresholds TH1, TH2, TH3 may be preset fixed values. Alternatively, the control circuit 150 may determine at least one of the thresholds TH1, TH2, TH3 based on the integral of the charge current measured over the period of time from the first charge time to the second charge time. That is, at least one of the thresholds TH1, TH2, TH3 may be updated each time the charge mode of the battery pack 10 starts. For example, the control circuit 150 may calculate a target value (for example, 60%) of SOC change by dividing the integral (for example, 3 Ah[ampere-hour]) of the charge current by the design capacity (for example, 5 Ah) of the battery cell BC, and determine at least one of the thresholds TH1, TH2, TH3 by multiplying a ratio of the reference factor to the target value by a predetermined scaling constant (a positive value). The scaling constant used to determine any one of the thresholds TH1, TH2, TH3 may be different from the scaling constant used to determine the other one. The target value may be determined during at least one of S610, S620 or S630. The at least one of the thresholds TH1, TH2, TH3 may be determined during at least one of S620 or S630.

In case that the plurality of battery cells $BC_1$~$BC_N$ is all normal, the target value and the reference factor are almost equal. In contrast, with the increasing number of battery cells afflicted by the internal short circuit fault among the plurality of battery cells $BC_1$~$BC_N$, the reference factor significantly decreases from the target value. Accordingly, it is possible to improve the accuracy of internal short circuit fault detection by determining at least one of the thresholds TH1, TH2, TH3 according to the above-described method.

Meanwhile, after the target value is determined before the step S620, in the step S620, only the first SOC changes less than the target value among all the first SOC changes of the plurality of battery cells $BC_1\sim BC_N$ may be used to determine the reference factor. In this case, in determining the reference factor, the first SOC changes more than the target value among all the first SOC changes of the plurality of battery cells $BC_1\sim BC_N$ are excluded, so the battery cells BC having relatively serious internal short circuit faults may be first detected from the plurality of battery cells $BC_1\sim BC_N$.

Figure 7:
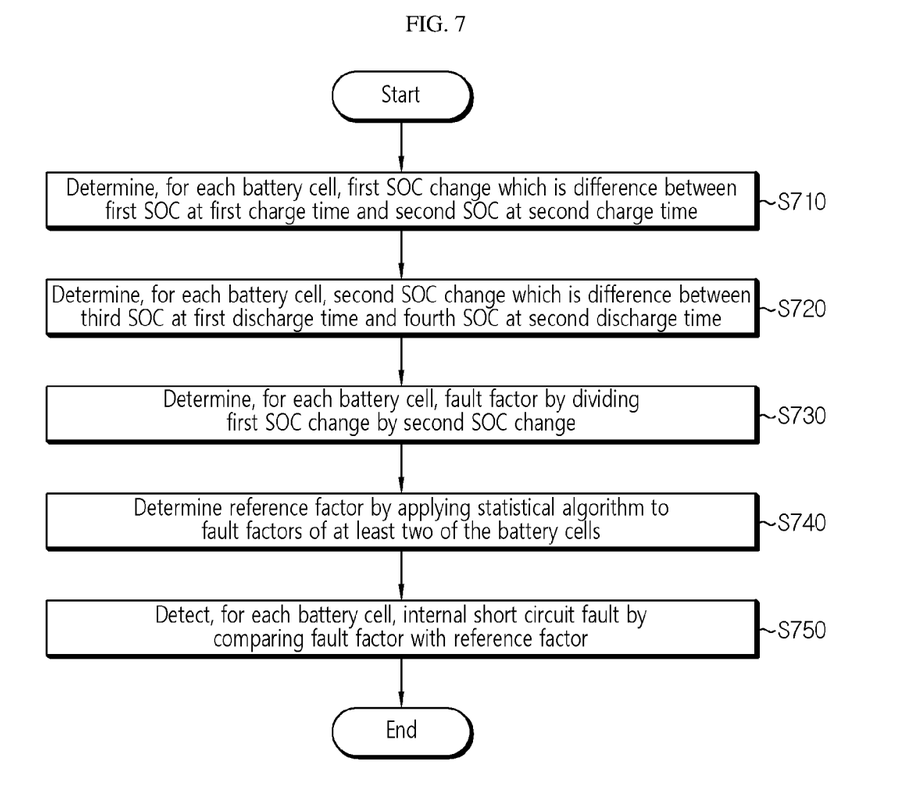
FIG. 7 is a flowchart exemplarily showing a battery management method according to a second embodiment of the present disclosure.

FIG. 7 is a flowchart exemplarily showing a battery management method according to a second embodiment of the present disclosure. The method of FIG. 7 is a method for detecting the internal short circuit fault in the battery cell BC based on the SOC trends of all the plurality of battery cells $BC_1\sim BC_N$ monitored in each of the latest discharge period and the latest charge period. For convenience of description, assume that the latest charge period ranges from time t4 to time t5, and the latest discharge period ranges from time t6 to time t7.

Referring to FIGS. 1 to 5 and 7, in step S710, the control circuit 150 determines, for each battery cell BC, a first SOC change which is a difference between a first SOC at a first charge time and a second SOC at a second charge time by applying the SOC estimation algorithm to the state parameter of each of the plurality of battery cells $BC_1\sim BC_N$ acquired during the charging of the battery pack 10. The first charge time and the second charge time are not particularly limited in case that they are two different points in time within the latest charge period. For example, the first charge time may be the start time t4 of the latest charge period, and the second charge time may be the end time t5 of the latest charge period.

In step S720, the control circuit 150 determines, for each battery cell BC, a second SOC change which is a difference between a third SOC at a first discharge time and a fourth SOC at a second discharge time by applying the SOC estimation algorithm to the state parameter of each of the plurality of battery cells $BC_1\sim BC_N$ acquired during the discharging of the battery pack 10. The first discharge time and the second discharge time are not particularly limited in case that they are two different points in time within the latest discharge period. For example, the first discharge time may be the start time t6 of the latest charge period, and the second discharge time may be the end time t7 of the latest charge period.

Referring to FIG. 5, in the faulty battery cell, the first SOC change is a difference between the first SOC 524 and the second SOC 525, and the second SOC change is a difference between the third SOC 526 and the fourth SOC 527. Although FIG. 7 shows that the step S710 is earlier than the step S720, it should be understood that this is provided by way of illustration. For example, in case that the latest charge period is earlier than the latest discharge period, the step S720 may be earlier than the step S710. In another example, after the end of both the latest charge period and the latest discharge period, the step S710 and the step S720 may be performed at the same time.

In step S730, the control circuit 150 determines, for each battery cell BC, a fault factor by dividing the first SOC change by the second SOC change. That is, the fault factor=(first SOC change)/(second SOC change). For example, referring to FIG. 5, the fault factor of the faulty battery cell={SOC(525)−SOC(524)}/{SOC(526)−SOC(527)}. The fault factor may be referred to as Coulomb efficiency.

In step S740, the control circuit 150 determines a reference factor by applying the statistical algorithm to the fault factors of at least two of the plurality of battery cells $BC_1\sim BC_N$ The reference factor may be equal to an average or median of the fault factors of at least two of the plurality of battery cells $BC_1\sim BC_N$. For example, referring to FIG. 5, in case that the curve 51 is an average SOC of the plurality of battery cells $BC_1\sim BC_N$, the reference factor={SOC(515)−SOC(514)}/{SOC(516)−SOC(517)}.

In step S750, the control circuit 150 detects, for each battery cell BC, the internal short circuit fault in the battery cell BC by comparing the fault factor with the reference factor. At least one of the following detection requirements may be used to detect the internal short circuit fault.

[Requirement #1: the fault factor should be smaller than the reference factor by a threshold TH11 or more]

[Requirement #2: the relative Coulomb efficiency should be equal to or less than a threshold TH12, where TH12 is 0~1]

[Requirement #3: a ratio of the fault factor to the reference factor should be smaller than its previous ratio by a threshold TH13 or more]

In requirement #2, the relative Coulomb efficiency is the ratio of the fault factor to the reference factor or (fault factor/reference factor).

In the requirement #3, the previous ratio is the ratio of the fault factor to the reference factor based on the first SOCs in the charge period (t4~t5 in FIG. 4) that is earlier than the latest discharge period (t6~t7) and the second SOCs in the discharge period (t2~t3 in FIG. 4).

The thresholds TH11, TH12, TH13 may be preset values. For example, the thresholds TH11, TH12, TH13 may be the same as the preset thresholds TH1, TH2, TH3 described above in the first embodiment, respectively. Alternatively, the control circuit 150 may determine at least one of the thresholds TH11, TH12, TH13 based on the integral of the charge current measured over the period of time from the first charge time to the second charge time and the integral of the discharge current measured over the period of time from the first discharge time to the second discharge time. That is, at least one of the thresholds TH11, TH12, TH13 may be updated each time the charge mode or the discharge mode of the battery pack 10 starts. For example, the control circuit 150 calculates a target value by dividing the integral of the charge current by the integral of the discharge current. Subsequently, the control circuit 150 may determine at least one of the thresholds TH11, TH12, TH13 by multiplying a ratio of the reference factor to the target value by a predetermined scaling constant (a positive value). The scaling constant used to determine any one of the thresholds TH11, TH12, TH13 may be different from the scaling constant used to determine the other one. The target value may be determined during at least one of S710, S720, S730 or S740. The at least one of the thresholds TH1, TH2, TH3 may be determined during at least one of S730 or S740.

In case that the plurality of battery cells $BC_1\sim BC_N$ is all normal, the target value and the reference factor are almost equal. In contrast, with the increasing number of battery cells afflicted by the internal short circuit fault among the plurality of battery cells $BC_1\sim BC_N$, the reference factor significantly decreases from the target value. Accordingly, it is possible to improve the accuracy of internal short circuit fault detection by determining at least one of the thresholds TH11, TH12, TH13 according to the above-described method.

Meanwhile, after the target value is determined before the step S740, in the step S740, only the fault factors less than the target value among all the fault factors of the plurality of battery cells $BC_1\sim BC_N$ may be used to determine the reference factor. In this case, in determining the reference factor, the fault factors more than the target value among all the fault factors of the plurality of battery cells $BC_1 \sim BC_N$ are excluded, so the battery cells BC having relatively serious internal short circuit faults may be first detected from the plurality of battery cells $BC_1 \sim BC_N$.

In each embodiment, when the internal short circuit fault is detected in a predetermined number or more of battery cells among the plurality of battery cells $BC_1 \sim BC_N$, the control circuit 150 may notify the presence of the faulty battery cell(s) to the vehicle controller 2 using the communication circuit 160.

In each embodiment, when the internal short circuit fault is detected in a predetermined number or more of battery cells among the plurality of battery cells $BC_1 \sim BC_N$, the control circuit 150 may reduce the allowable range of the charge/discharge current. For example, the upper limit (a positive value) of the allowable range may decrease or the lower limit (a negative value) of the allowable range may increase in proportion to the number of faulty battery cell(s).

The embodiments of the present disclosure described hereinabove are not implemented only through the apparatus and method, and may be implemented through programs that perform the functions corresponding to the configurations of the embodiments of the present disclosure or recording media having the programs recorded thereon, and such implementation may be easily achieved by those skilled in the art from the disclosure of the embodiments described above.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and all or some of the embodiments may be selectively combined to allow various modifications.

| (Description of Reference Numerals) | |
| --- | --- |
| 1: Electric vehicle | 2: Vehicle controller |
| 10: Battery pack | 11: Battery |
| 20: Relay | 30: Inverter |
| 40: Electric motor | |
| 100: Battery management system | |
| 110: Sensing circuit | |
| 150: Control circuit | |

What is claimed is:

1. A battery management system for a battery pack including a plurality of battery cells connected in series, the battery management system comprising:
a sensing circuit configured to acquire a state parameter of each battery cell; and
a control circuit configured to:
determine, for each battery cell, a first state of charge (SOC) change which is a difference between a first SOC at a first charge time and a second SOC at a second charge time by applying an SOC estimation algorithm to the state parameter acquired during charging of the battery pack;
determine a reference factor by applying a statistical algorithm to the first SOC changes of at least two of the plurality of battery cells; and
for each battery cell, detect an internal short circuit fault in the battery cell based on the first SOC change of the battery cell and the reference factor.

2. The battery management system according to claim 1, wherein the control circuit is configured to determine the reference factor to be equal to an average or median of at least two of the first SOC changes of the plurality of battery cells.

3. The battery management system according to claim 2, wherein the control circuit is configured to, for each battery cell, determine the internal short circuit fault in response to a ratio of the first SOC change to the reference factor being equal to or smaller than a threshold.

4. The battery management system according to claim 2, wherein the control circuit is configured to, for each battery cell:
calculate a ratio of the first SOC change to the reference factor at a plurality of different charge times; and
determine the internal short circuit fault in response to the ratio of the first SOC change to the reference factor at one charge time being smaller than the ratio of the first SOC change to the reference factor at a previous charge time by a threshold or more.

5. The battery management system according to claim 1, wherein the control circuit is configured to:
determine, for each battery cell, a second SOC change which is a difference between a third SOC at a first discharge time and a fourth SOC at a second discharge time by applying the SOC estimation algorithm to the state parameter acquired during discharging of the battery pack,
for each battery cell, determine a fault factor of the battery cell by dividing the first SOC change of the battery cell by the second SOC change of the battery cell,
determine a second reference factor by applying the statistical algorithm to the fault factors of at least two of the plurality of battery cells, and
for each battery cell, detect the internal short circuit fault in the battery cell based on the fault factor of the battery cell and the second reference factor.

6. The battery management system according to claim 5, wherein the control circuit is configured to:
determine the second reference factor to be equal to an average or median of the fault factors of at least two of the plurality of battery cells, and
for each battery cell, detect the internal short circuit fault in the battery cell by comparing the fault factor of the battery cell with the second reference factor.

7. The battery management system according to claim 6, wherein the control circuit is configured to, for each battery cell, determine the internal short circuit fault in response to a ratio of the fault factor to the second reference factor being equal to or smaller than a threshold.

8. The battery management system according to claim 6, wherein the control circuit is configured to, for each battery cell:
calculate a ratio of the fault factor to the second reference factor at a plurality of different discharge times; and
determine the internal short circuit fault in response to a ratio of the fault factor to the second reference factor at one discharge time being smaller than the ratio of the fault factor to the second reference factor at a previous discharge time by a threshold or more.

9. A battery pack, comprising
the battery management system according to claim 1; and
the plurality of battery cells.

10. An electric vehicle comprising the battery pack according to claim 9.

11. A battery management method for a battery pack including a plurality of battery cells connected in series, the battery management method comprising:
- determining, by a control circuit, for each battery cell, a first state of charge (SOC) change which is a difference between a first SOC at a first charge time and a second SOC at a second charge time by applying an SOC estimation algorithm to a state parameter of each of the plurality of battery cells acquired during charging of the battery pack;
- determining, by the control circuit, a reference factor by applying a statistical algorithm to the first SOC changes of at least two of the plurality of battery cells; and
- for each battery cell, detecting, by the control circuit, an internal short circuit fault in the battery cell based on the first SOC change of the battery cell and the reference factor.

12. The battery management method according to claim 11, wherein the reference factor is equal to an average or median of at least two of the first SOC changes of the plurality of battery cells.

13. The battery management method according to claim 12, wherein detecting the internal short circuit fault is based on a ratio of the first SOC change to the reference factor being equal to or smaller than a threshold.

14. The battery management method according to claim 12, wherein detecting the internal short circuit fault is based on a ratio of the first SOC change to the reference factor at one charge time being smaller than the ratio of the first SOC change to the reference factor at a previous charge time by a threshold or more.

* * * * *